(12) United States Patent
Spurell

(10) Patent No.: US 6,501,346 B1
(45) Date of Patent: Dec. 31, 2002

(54) CERAMIC FILTER FOR USE WITH A BEACON RECEIVER

(75) Inventor: Doug Spurell, Calgary (CA)

(73) Assignee: Communications Systems International, Inc. (CA)

( * ) Notice: Subject to any disclaimer, the term of this patent is extended or adjusted under 35 U.S.C. 154(b) by 0 days.

(21) Appl. No.: 09/658,669

(22) Filed: Sep. 8, 2000

Related U.S. Application Data

(60) Provisional application No. 60/153,151, filed on Sep. 9, 1999.

(51) Int. Cl.[7] ................................................. H03H 9/54
(52) U.S. Cl. ...................... 333/189; 333/187; 333/202; 375/316
(58) Field of Search ............................... 333/186–192, 333/202, 206; 375/316

(56) References Cited

U.S. PATENT DOCUMENTS

| | | | | |
|---|---|---|---|---|
| 3,585,537 A | * | 6/1971 | Rennick et al. | 333/191 |
| 4,398,162 A | | 8/1983 | Nagai | 333/189 |
| 4,785,463 A | * | 11/1988 | Janc et al. | 375/1 |
| 5,912,798 A | * | 6/1999 | Chu | 361/321.3 |
| 5,926,079 A | * | 7/1999 | Heine et al. | 333/208 |
| 5,929,721 A | | 7/1999 | Munn et al. | 333/134 |
| 5,995,556 A | * | 11/1999 | Thomas, Jr. | 375/316 |
| 6,081,171 A | * | 6/2000 | Ella | 333/189 |
| 6,215,828 B1 | * | 4/2001 | Signell et al. | 375/316 |

OTHER PUBLICATIONS

J.D. Last & D.C. Poppe; "Effect of Skywave Interference on Coverage of Radiobeacon DGPS Stations "; IEEE Proc.–Radar, Sonar Navig., vol. 144, No. 3, Jun. 1997, pp. 163–168, Jun. 1997.*

* cited by examiner

*Primary Examiner*—Robert Pascal
*Assistant Examiner*—Barbara Summons
(74) *Attorney, Agent, or Firm*—Cantor Colburn LLP

(57) ABSTRACT

An exemplary embodiment of the invention is a ceramic filter for use as a front-end filter feeding directly into an A-D portion of a digital signal processor to form a radio-beacon DGPS receiver. The filter includes a plurality of piezo-electric resonant stacks in a multi-stage topology to emulate a discrete component ladder network, representing a Butterworth filter modified to exhibit the roll-off characteristics of an Elliptical band-pass filter. This embodiment has a pass-band center frequency at about 304 kHz±1.5 kHz. The ceramic filter uses square and circular shaped ceramic piezo-electric resonant elements to provide enhanced performance and reduced size. The square and circular piezo-electric resonant elements, sandwiched between spring-plates, are arranged in horizontal layers with said spring-plates at filter section boundaries being joined by tabs at the respective layers.

3 Claims, 4 Drawing Sheets

CERAMIC FILTER FOR USE WITH A BEACON RECEIVER

CROSS-REFERENCE TO RELATED APPLICATIONS

This application claims the benefit of U.S. provisional patent application serial No. 60/153,151 filed Sep. 9, 1999, the entire contents of which are incorporated herein by reference.

BACKGROUND OF THE INVENTION

The invention relates to ceramic filters and in particular to a specific design of a ceramic filter for use with a radio-beacon receiver. Radio-Beacon receivers are commonly used in certain Differential Global Positioning Systems (DGPS) for accurate navigational and position-locating needs. The international DGPS radio-beacon networks operate in the rf-band of 283-kHz to 325-kHz. To produce a quality radio-beacon receiver, the front-end filter is required to exhibit high-Q properties to provide high selectivity. Conventional beacon receivers based on prior art design techniques have relied upon multiple-pole discrete component ladder-type front-end filter networks, but these had difficulty in maintaining high attenuation in the stop-band whilst also achieving a narrow pass-band with low ripple and low insertion-loss. Such conventional filter networks also imposed the use of very tight tolerance discrete components and quite often invoked the need for custom manufactured components, particularly for the inductor elements. With these impositions and the constraints of critical layout design to achieve desired characteristics, the conventional solutions proved both costly and somewhat unpredictable.

FIG. 1 is a block diagram of a prior art system for implementing a radio-beacon DGPS receiver. This design entails a combination of analogue processing and digital processing stages. A front-end band pass filter 10 is used to select signals having a frequency in the range of 283 kHz to 325 kHz. The filtered signal is then provided to a multiplier 11, an Intermediate Frequency (IF) filter 12 and an amplifier 14 to perform dual down-conversion. Exemplary dual down-conversion converts the input signal from 283-kHz to 325-kHz down to 43-kHz to 85-kHz. The down-converted signal is then applied as input to an A-D converter 16 and a digital signal processor 18. Feedback to the amplifier 14 is provided from the digital signal processor 18 through D-A converter 20.

BRIEF SUMMARY OF THE INVENTION

An exemplary embodiment of the invention is a novel ceramic filter for use as a front-end filter in an innovative radio-beacon DGPS receiver. The filter includes a plurality of piezo-electric resonant stacks in a multi-stage topology to emulate a discrete component ladder network, representing a band-pass filter derived from a combination of a modified Butterworth filter and Elliptical filter, having a pass-band center frequency at about 304 kHz±1.5 kHz. The ceramic filter uses square and circular shaped ceramic piezo-electric resonant elements to provide enhanced performance and reduced size. The square and circular piezo-electric resonant elements, sandwiched between spring-plates, are arranged in horizontal layers. The filter stages are serially linked, at the necessary stage boundaries, with the spring-plates at the respective layers joined by tabs.

DETAILED DESCRIPTION OF THE INVENTION

Figure 1:
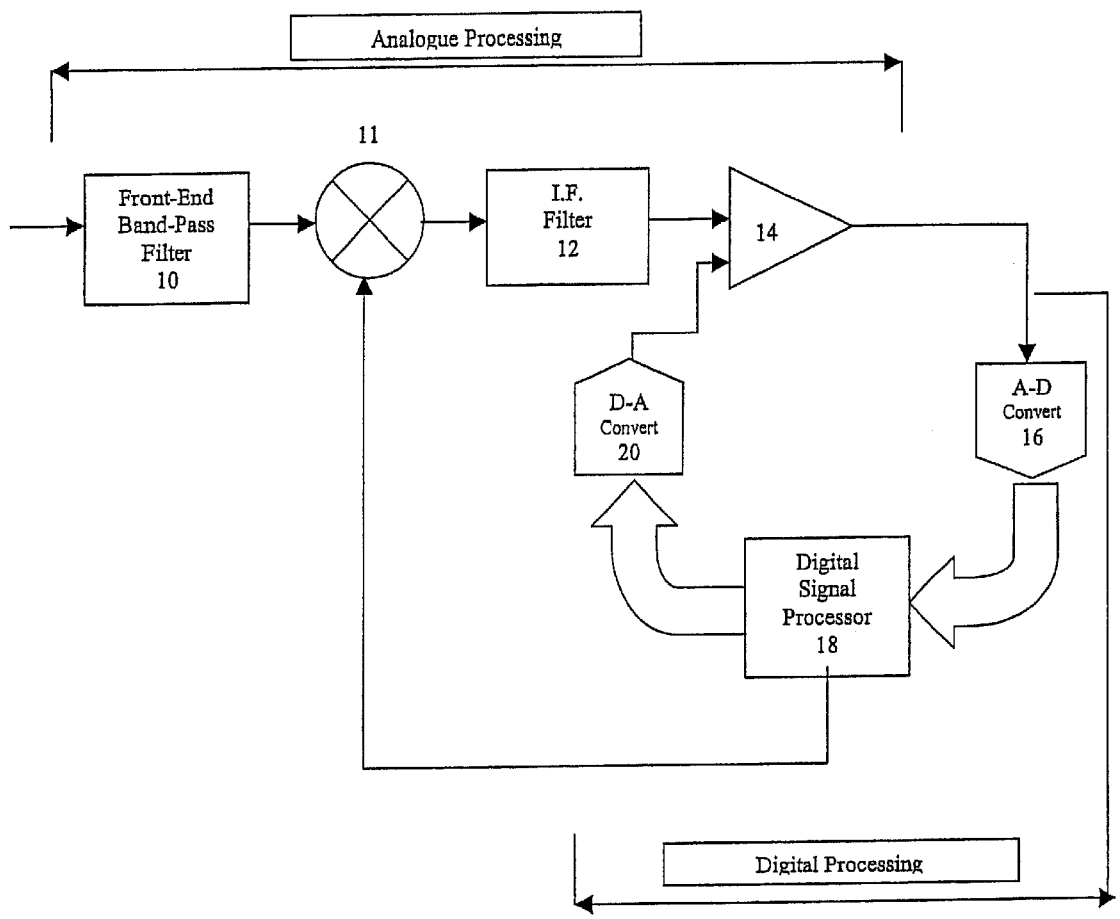
FIG. 1 is a block diagram of a prior art radio-beacon receiver.
Figure 2:
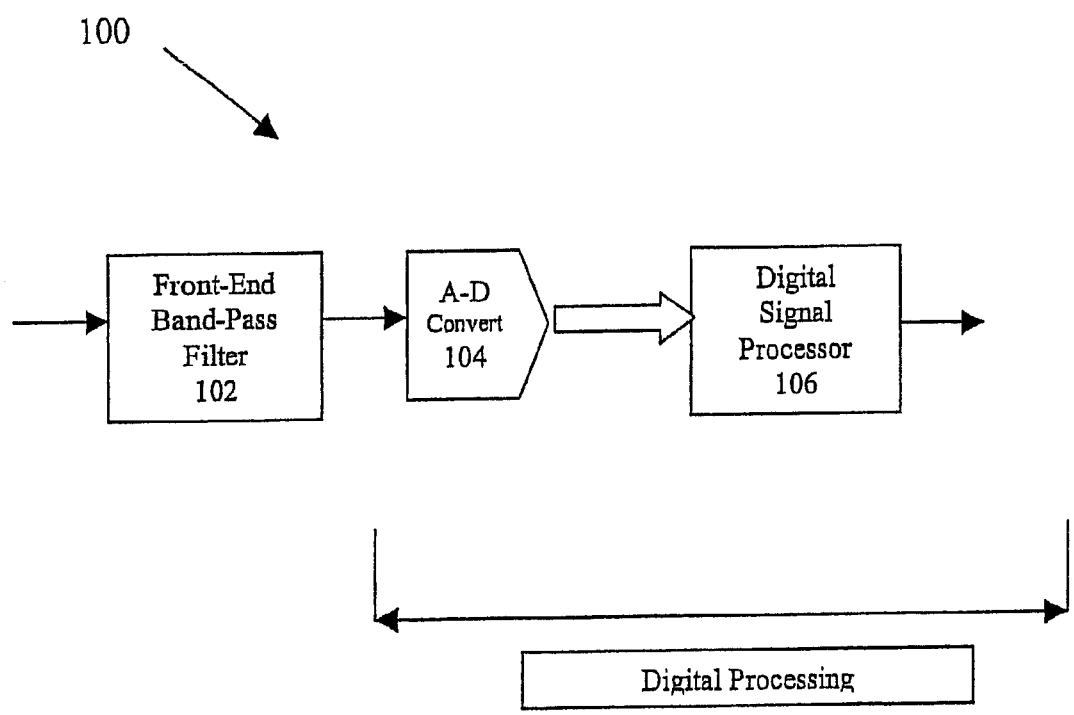
FIG. 2 is a block diagram of a radio-beacon receiver in an exemplary embodiment of the invention.

FIG. 2 is a block diagram of a radio-beacon receiver, shown generally as 100, in an exemplary embodiment of the invention, which enables direct digital processing. The receiver 100 includes a ceramic, front-end band-pass filter 102. The filter 102 is preferably a small, low cost, single module ceramic resonant filter exhibiting a high-Q characteristic. When used in the exemplary radio-beacon receiver, the filter 102 provides front-end selectivity for the radio-beacon receiver that operates, nominally centered on a frequency of 304-kHz. The international DGPS radio beacon networks operate in the rf-band of 283-kHz to 325-kHz. The output of the filter 102 is applied directly to an A-D converter 104 and then to a digital signal processor (DSP) 106. The performance of the filter 102 eliminates the need for dual down-conversion and the filter output is applied directly to the A-D converter 104. Because the output of the ceramic-filter can be applied directly to the A-D converter 104, this eliminates the second down-conversion and improves the noise performance of the receiver. Consequently, the filter 102 permits a smaller more concise physical implementation of a beacon-receiver. The subsequent reduction in components, coupled with more consistent repeatability, supports cost savings in production. Additionally, through use of a front-end, ceramic filter 102, the overall performance of the receiver 100 is improved.

Figure 3:
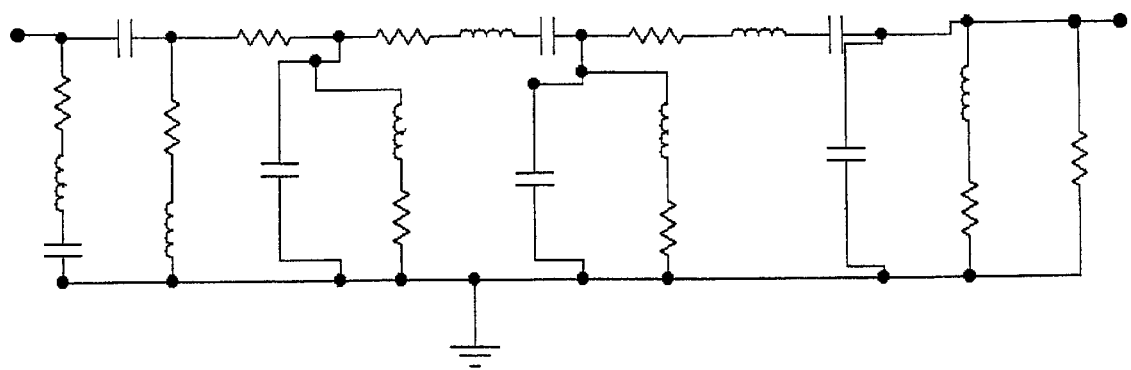
FIG. 3 is a schematic diagram of a prior art filter arrangement used to derive the implementation in ceramic as an embodiment of the invention.

In a preferred embodiment, the ceramic filter 102 emulates a band-pass filter derived from a 5-pole Butterworth band-pass filter such as that prior art shown in FIG. 3. The implementation in ceramic piezo-electric resonators enables the filter to possess sharper roll-off on the side-slopes, than is achievable with discrete component implementations. This also eliminates the costly, tight tolerance items as conventionally implemented in a discrete-component ladder-type network, such as the type depicted in FIG. 3. As described herein with reference to FIG. 4, the ceramic filter 102 includes ceramic piezo-electric resonant stacks in a multi-stage topology to represent a high-Q band-pass filter, with a center frequency about 304 kHz±1.5 kHz. This multi-stage configuration of ceramic piezo-electric resonant elements provides a pass-band of about 45.0 kHz (min.), at the 3 dB break-points and a pass-band of about 200 kHz (max), at the 60 dB break-points. The ceramic piezo-electric resonant elements provide isolation attenuation of 80 dB (min.), at 304±100 kHz an insertion loss of 6.0 dB (max.)

throughout the pass-band of 304 kHz±22.5 kHz. The in-band ripple is 3.0-dB (max.) throughout the pass-band of 304 kHz±22.5 kHz. With respect to impedance, ceramic filter 102 has a nominal input impedance of 300 ohms and a nominal output impedance of 3,000 ohms.

The ceramic filter 102 segregates received signals in a select, narrow band of frequencies over the rf-band of about 283-kHz to about 325-kHz, to provide front-end selectivity for a radio-beacon DGPS receiver. Ceramic filter 102 matches impedance values for the interface between an antenna and the digital processing stage of the innovative beacon-receiver. The ceramic filter 102 is designed to maintain the above-described performance characteristics over a wide variance of ambient conditions. The environmental specifications include conditions such as having temperature variations between −30° C. and +70° C., humidity variations up to 75% relative humidity and vibration levels equivalent to displacement up to ±1.5-millimeters at frequencies in the range 10-Hz to 55-Hz.

Figure 4:
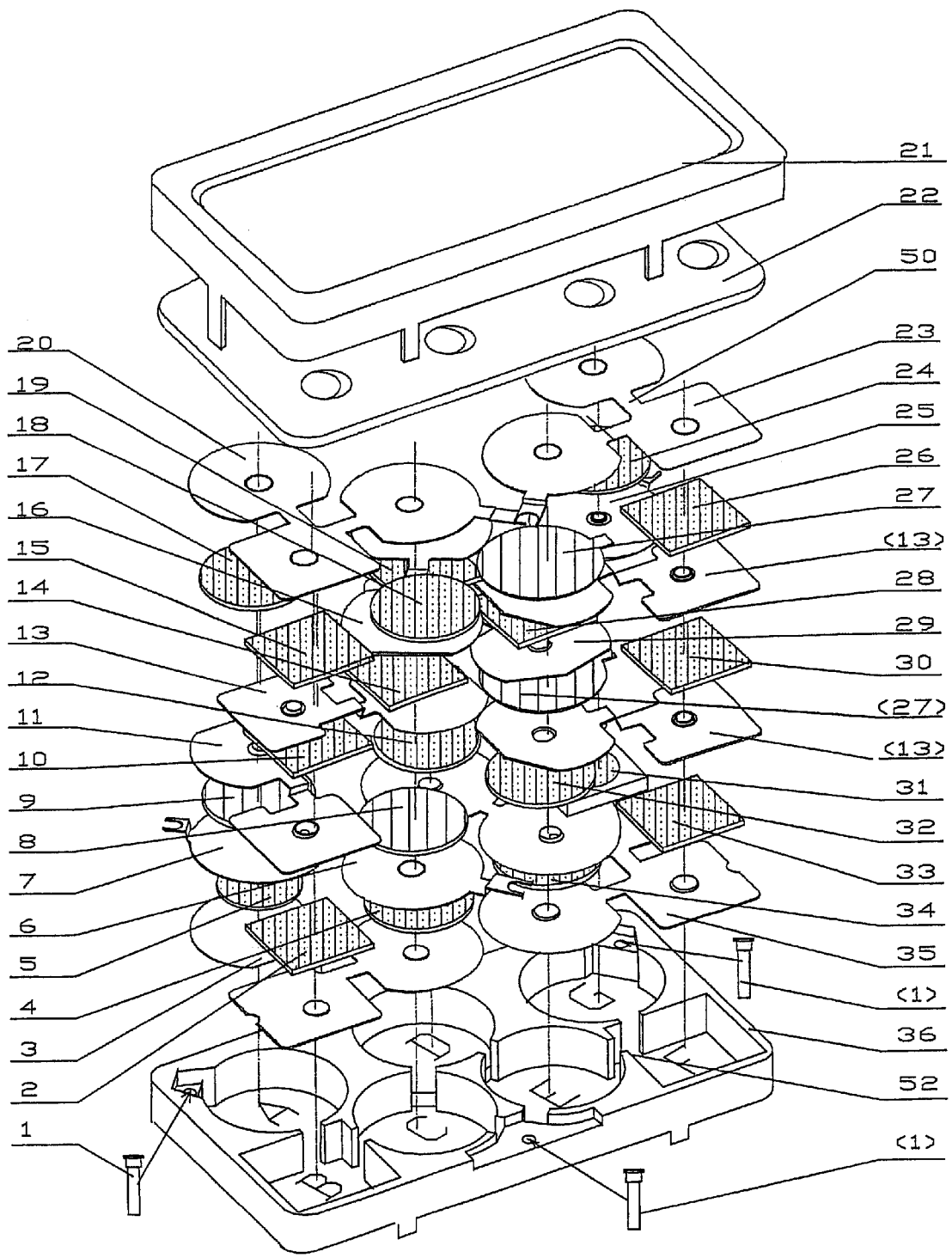
FIG. 4 is an exploded view of a ceramic filter in an exemplary embodiment of the invention.

FIG. 4 is an exploded, perspective view of an exemplary implementation of ceramic filter 102. The base housing 36 forms seven compartments (labeled A, B, C, D, E, F and G) that hold the stacks of piezo-electric resonators forming the nine distinct filter-stages which constitute the complete filter assembly. An insulator plate 22 is provided between the top layer and the housing cover 21. Three terminal leads 1 are provided for input, ground and output. The terminal leads 1 protrude through the bottom of the base housing 36, with connections at appropriate points in the stacked sections. Each elemental-section of the filter is comprised of "sandwich" layers formed by a lower spring-plate, a ceramic resonator piezo-electric element and an upper spring-plate. In FIG. 4, the spring plates are elements 3, 6, 7, 11, 13, 16, 20, 23, 25, 29 and 35. The ceramic resonators are elements 2, 4, 5, 10, 12, 14, 15, 17, 18, 19, 24, 26, 28, and 30–34. The filter sections are constructed by combining the elemental-sections together in either one, two or three elemental-sections. Horizontal serial linking is achieved by tabs (such as element 50) joining certain spring-plates together. The tabs 50 slide into slots (such as 52) in the base housing 36 compartment walls.

In order to achieve the required nine stages of filtering within the size constraints, certain sections need to be insulated from each other by insulation wafers 8, 9 and 27 positioned between appropriate layers of spring-plates. It can be seen from FIG. 4 that combinations of both square shaped and circular shaped ceramic resonator piezo-electric elements are utilized in the construction to achieve the required characteristics of the filter unit. Once the stacks are assembled into the base housing 36, a top insulating layer 22 is applied before the metal cover 21 is fitted in place and crimped onto the base housing 36. The attachment of the metal cover 21 provides the necessary clamping pressure to the stacked sections held in the seven compartments and also provides an overall case for the device. The final assembly process is to fill the underside of the base housing with an epoxy solution so as to bond the metal cover 21 to the base housing 36. This affects an environmental seal that serves to protect the metalization on the piezo-electric elements and the plating finish on the various spring-plates from oxidation.

To achieve the required 80-dB out-of-band attenuation, a serially linked multi-staged configuration was developed over conventional, prior art, two-stage devices. The embodiment of FIG. 4 includes eighteen ceramic resonators in a nine-stage configuration, housed in seven compartments. To achieve the requirements of maximum 3.0-dB in-band ripple and ensure spurious responses better than −55 dB within a frequency range 0.1 MHz to 1.6 MHz, the embodiment of FIG. 4 uses a combination of both square and circular shaped ceramic resonator elements. To achieve a reduced height, the embodiment of FIG. 4 incorporates a horizontal format for the serial linking of spring-plates over the various stacks of ceramic resonator piezo-electric elements through tabs (such as element 50), in contrast to conventional vertical formats of prior art designs.

Prior art, ceramic filters involved the use of many spring-contacts in a very complex assembly. Experience shows that the spring-contacts were prone to breakage or being easily deformed during the production processes because of their small size. To improve the overall quality and producibility of the ceramic filter devices, the embodiment of FIG. 4 includes nine stages of filtering, or blocks of ceramic filter sections. Each section is comprised of one or more layers of a ceramic resonator piezo-electric element positioned between an upper spring-plate and a lower spring-plate. The base housing 36 provides individual compartments, for the different shaped ceramic filter sections, to more accurately position the stacks. The base housing 36 also includes openings (such as element 52) in compartment walls allowing the tabs (such as element 50) on the spring-plates to be inserted through the compartment walls to provide the horizontal serial linking. The spring-plates tightly secure each filter section in position, once the metal case is affixed. Flat contact points on the ceramic elements and the spring-plates to provide larger contact areas with more consistency to achieve higher production yields.

The embodiment of FIG. 4 reduces the number of contacts by approximately 50% when compared to the prior art technology that would have been necessary to produce a device exhibiting similar properties. As a direct result of reducing the number of contacts, the size of filter devices can be almost 50% of those produced utilizing traditional prior art technology; this can also help realize cost reductions. By reducing the complexity, the assembly process is simplified and subsequently reduces potential problems arising during production.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed for carrying out this invention, but that the invention will include all embodiments falling within the scope of the appended claims.

What is claimed is:

1. A ceramic band-pass filter device for use as the front end of a radio-beacon DGPS receiver, said ceramic band-pass filter providing high-Q selectivity in the rf spectrum over the range 283-kHz to 325-kHz, wherein said ceramic band-pass filter emulates a discrete component ladder network having a pass-band center frequency at about 304 kHz±1.5 kHz at an ambient temperature of +25° C.;

wherein said ceramic band-pass filter emulates a discrete component ladder network representing a 5-pole Butterworth filter exhibiting the roll-off characteristics of an elliptical filter;

wherein ceramic band-pass filter provides a minimum pass-band of 45.0 kHz at 3 dB break-points;

wherein said ceramic band-pass filter provides a maximum pass-band of 200 kHz at 60 dB break-points;

wherein said ceramic band-pass filter provides an out-of-band rejection of 80 dB outside of 304 kHz±100 kHz;

wherein said ceramic band-pass filter presents a maximum Insertion-Loss of 6.0 dB, throughout the pass-band of 304 kHz±22.5 kHz;

wherein said ceramic band-pass filter presents a maximum in-band ripple of 3.0 dB, throughout the pass-band of 304 kHz±22.5 kHz;

wherein said ceramic band-pass filter exhibits a nominal input impedance of 300 ohms.

2. A ceramic filter device according to claim 1 wherein said ceramic band-pass filter exhibits a nominal output impedance of 3,000 ohms.

3. A ceramic filter device according to claim 2 wherein said ceramic band-pass filter exhibits spurious responses no greater than 55 dB, referenced to said insertion loss, within a frequency range 0.1 MHz to 1.6 MHz.

* * * * *